(12) United States Patent
Kushta

(10) Patent No.: US 8,476,537 B2
(45) Date of Patent: Jul. 2, 2013

(54) MULTI-LAYER SUBSTRATE

(75) Inventor: Taras Kushta, Tokyo (JP)

(73) Assignee: NEC Corporation, Tokyo (JP)

( * ) Notice: Subject to any disclaimer, the term of this patent is extended or adjusted under 35 U.S.C. 154(b) by 286 days.

(21) Appl. No.: 12/675,678

(22) PCT Filed: Aug. 31, 2007

(86) PCT No.: PCT/JP2007/067456
§ 371 (c)(1),
(2), (4) Date: Jul. 20, 2010

(87) PCT Pub. No.: WO2009/028108
PCT Pub. Date: Mar. 5, 2009

(65) Prior Publication Data
US 2010/0282503 A1    Nov. 11, 2010

(51) Int. Cl.
*H05K 1/11*    (2006.01)
(52) U.S. Cl.
CPC ......................................... *H05K 1/11* (2013.01)
USPC .......................................... 174/262; 174/266
(58) Field of Classification Search
CPC ...... H05K 1/0251; H05K 1/116; H05K 1/0219
USPC ......... 174/250, 255, 262, 261, 266; 333/246, 333/185
See application file for complete search history.

(56) References Cited

U.S. PATENT DOCUMENTS

| | | | |
|---|---|---|---|
| 2002/0034839 A1 | 3/2002 | Iwaki et al. | |
| 2002/0130737 A1* | 9/2002 | Hreish et al. | 333/204 |
| 2004/0136169 A1 | 7/2004 | Morimoto et al. | |
| 2004/0263181 A1* | 12/2004 | Ye et al. | 324/534 |
| 2006/0091545 A1 | 5/2006 | Casher et al. | |
| 2006/0151869 A1 | 7/2006 | Gisin et al. | |
| 2006/0197625 A1* | 9/2006 | Kashiwakura | 333/33 |
| 2007/0018752 A1* | 1/2007 | Miller | 333/33 |

FOREIGN PATENT DOCUMENTS

| | | |
|---|---|---|
| JP | 06-302964 A | 10/1994 |
| JP | 11-67969 A | 3/1999 |
| JP | 2000-188478 A | 7/2000 |
| JP | 2003-218481 A | 7/2003 |
| JP | 2004-146810 A | 5/2004 |
| JP | 2004-521536 A | 7/2004 |
| JP | 2004-363975 A | 12/2004 |
| JP | 2005-277028 A | 10/2005 |
| JP | 2008-28333 A | 2/2008 |
| JP | 2008-527724 A | 7/2008 |
| WO | 2004/107830 A1 | 12/2004 |

OTHER PUBLICATIONS

Office Action, issued in counterpart Japanese Application No. 2010-508543 dated Mar. 8, 2012.

* cited by examiner

*Primary Examiner* — Yuriy Semenenko
(74) *Attorney, Agent, or Firm* — Sughrue Mion, PLLC

(57) ABSTRACT

A multi-layer substrate includes a planar transmission line structure and a signal via, which are connected by a multi-tier transition. The multi-tier transition includes a signal via pad configured to serve for a full-value connection of the signal via and the planar transmission line; and a dummy pad connected to the signal via, formed in an area of a clearance hole in a conductor layer disposed between a signal terminal of the signal via and the planar transmission line, and isolated from the conductor layer.

4 Claims, 20 Drawing Sheets

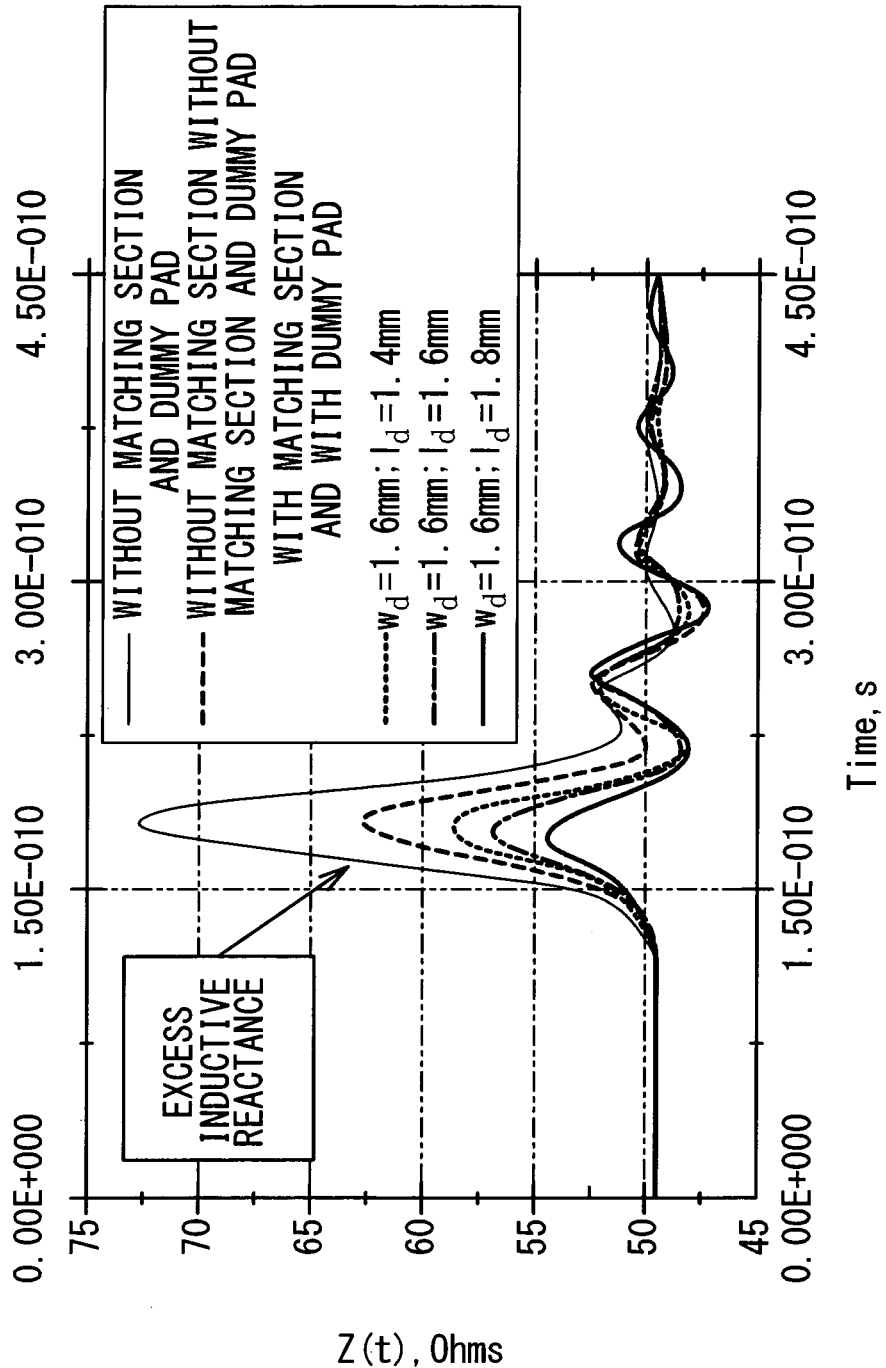

MULTI-LAYER SUBSTRATE

TECHNICAL FIELD

The present invention relates to a multi-layer substrate with a high-speed interconnection structure to provide high-speed data transmission.

BACKGROUND ART

High-speed transmission technologies are a main theme in next-generation networking and computing systems. Their cost is an important problem to be solved to make the systems competitive in the market. A multi-layer substrate is one of the important techniques, which can satisfy both high-speed and cost-effective conditions within a predetermined frequency band and interconnection length. Electrical wiring in a planar conductor layer of the multi-layer substrate (board) can be developed on the basis of transmission lines such as microstrip lines, strip lines, and coplanar lines. Vertical interconnections in the board which serve mainly to connect planar transmission line structures disposed in different conductor layers are usually based on various types of via structures such as through-hole vias, blind vias, counter-bored, and buried vias.

Keeping the characteristic impedance within a predetermined level (within 10% as an example) through the whole path of an interconnection circuit between terminals is an important problem, especially in the design of the multi-layer substrate used in high-speed data transmission. This problem is equally related to both single-ended and differential signaling. Also, reduction of transformation from a differential mode to a common mode and from the common mode to the differential mode is another issue which has to be overcome in the high-speed multi-layer substrate. To improve the characteristic impedance control and to decrease leakage loss in a signal via structure in a higher frequency range, ground vias can be used around the signal via structure (single-ended or differential structure).

Also, electrical performance of the signal via structure is dependent on the shape and dimension of a clearance hole formed in an area for the signal via structure in conductor layers of the multi-layer substrate to provide passing a signal via without any electrical contact with other conductive surfaces in these conductor layers. As a result, a transition from a via structure (single-ended or differential structure) to a planar transmission line becomes at the front because in this transition characteristic impedance mismatching can appear due to a large clearance hole. This impedance mismatching can excite a large reflection loss, a stray resonance and other unwanted effects. Moreover, in differential interconnection circuits, impedance mismatching can give a considerable increase of transformation between differential and common modes.

In Japanese Patent Application Publication (JP-P2004-363975A), a transition from a signal via pad to a coplanar transmission line interconnection is presented. In this related art, the transition has a form of coplanar transmission line having the width of a signal strip and distance to the ground plane providing its characteristic impedance matching to the coplanar transmission line interconnection. In Japanese Patent (JP-6-302964), a transition in the form of a linear taper connecting via pads (lands) of different diameters in a multi-layer board is shown. In Japanese Patent Application Publication (JP-P2003-218481A), a linear taper connecting planar transmission lines of different widths is presented. In US Patent Application Publication (US 2006/0091545A1), a transition from a differential signal via pair to a couple of transmission lines is provided by controlling the length of transmission line segments in the area of the clearance hole and also by an appropriate selection of the width of these segments.

DISCLOSURE OF INVENTION

It is an object of the present invention to provide a multi-layer substrate including an impedance-controllable structure connecting a signal via or a signal via pair and a planar transmission line as a single-ended or differential structure. Such structure is formed as a multi-tier transition comprising a dummy pad (or a number of dummy pads) in the area of a clearance hole and a matching section joining the signal via pad and the transmission line.

It is another object of the present invention to reduce transformation between differential and common modes in differential interconnections including the signal via pair and couple of transmission lines. This target in the present invention is achieved by forming an appropriate ground system in the area of the clearance hole and a multi-tier transition includes dummy pads connected to signal vias.

In an exemplary aspect of the present invention, a multi-layer substrate includes a planar transmission line structure and a signal via, which are connected by a multi-tier transition. The multi-tier transition includes a signal via pad configured to serve for a full-value connection of the signal via and the planar transmission line; and a dummy pad connected to the signal via, formed in an area of a clearance hole in a conductor layer disposed between a signal terminal of the signal via and the planar transmission line, and isolated from the conductor layer.

In another exemplary aspect of the present invention, a multi-layer substrate providing differential signal propagation comprising a planar transmission line pair and a signal via pair, which are connected by a multi-tier transition. The multi-tier transition includes two signal via pads configured to serve for a full-value connection of the signal via pair and the planar transmission line pair; and two dummy pads connected to the two signal vias, formed in an area of a clearance hole in a conductor layer disposed between a differential signal via terminal of the signal via pair and the planar transmission line pair, and isolated from each other and from the conductor layer.

In still another exemplary aspect of the present invention, a multi-layer substrate providing differential signal propagation comprising a planar transmission line pair and a signal via pair, which are connected by a multi-tier transition. The multi-tier transition includes two signal via pads configured to serve for a full-value connection of the signal via pair and the planar transmission line pair; two dummy pads connected to the two signal vias, formed in an area of a clearance hole in a ground layer disposed between a differential signal via terminal of the signal via pair and the planar transmission line pair, and isolated from each other and from the ground layer; and a ground system formed symmetrically in the area of the clearance hole between vias of the signal via pair in the ground layer.

BRIEF DESCRIPTION OF DRAWINGS

FIG. 3 is a graph of the characteristic impedance in time domain which shows advantages of the use of the multi-tier transition between a signal via structure and a planar transmission line;

BEST MODE FOR CARRYING OUT THE INVENTION

Figure 1A:
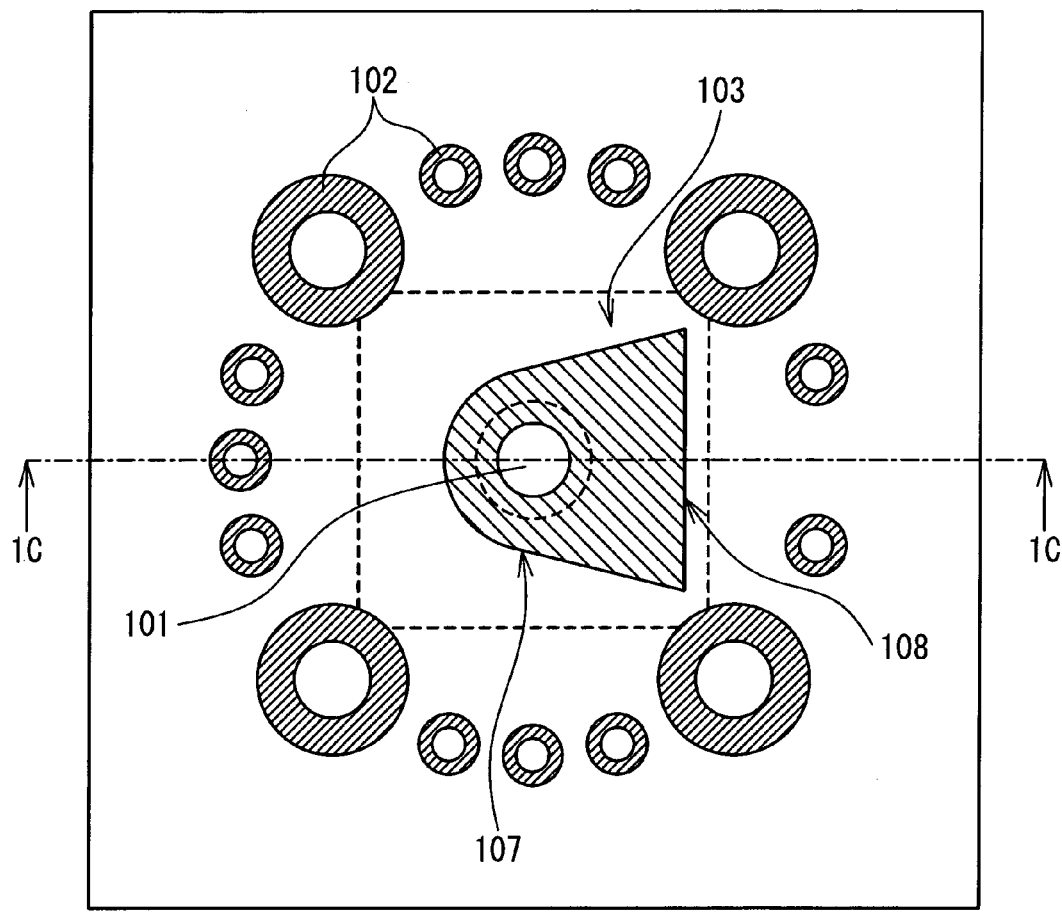
FIGS. 1A to 1D are diagrams showing a multi-layer substrate including a multi-tier transition between a signal via structure and a planar transmission line according to a first embodiment of the present invention.
Figure 1B:
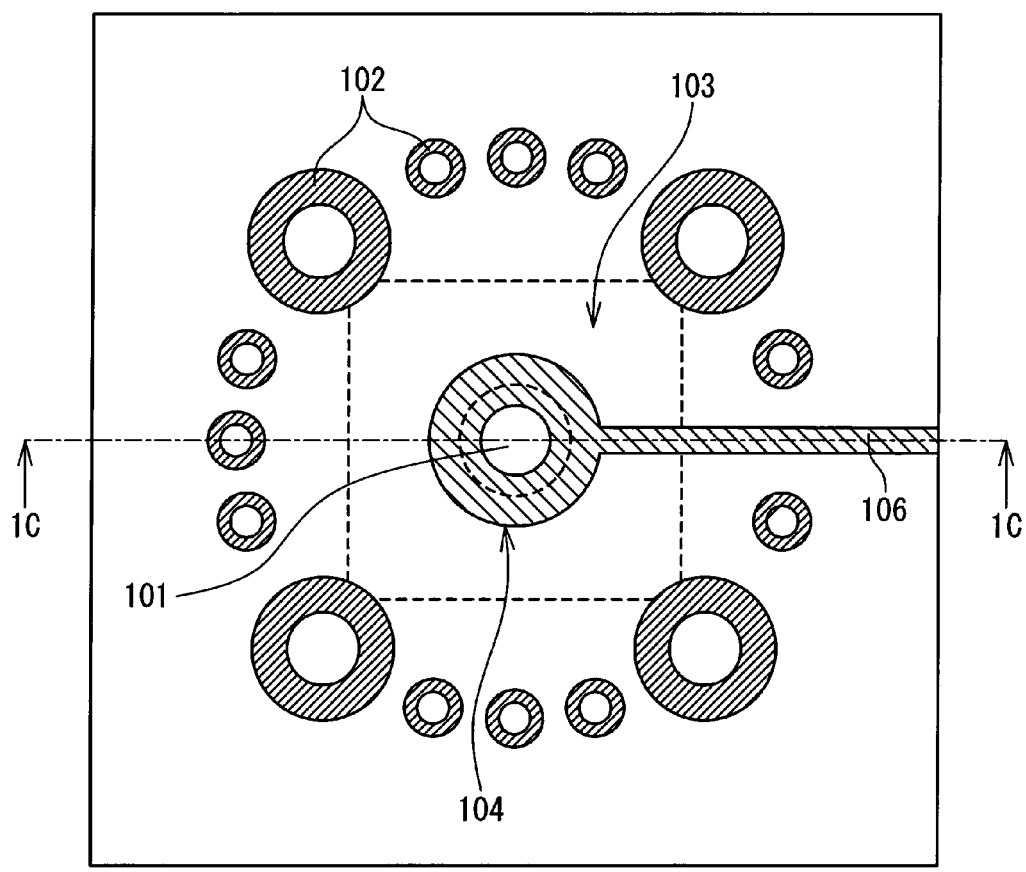
Figure 1C:
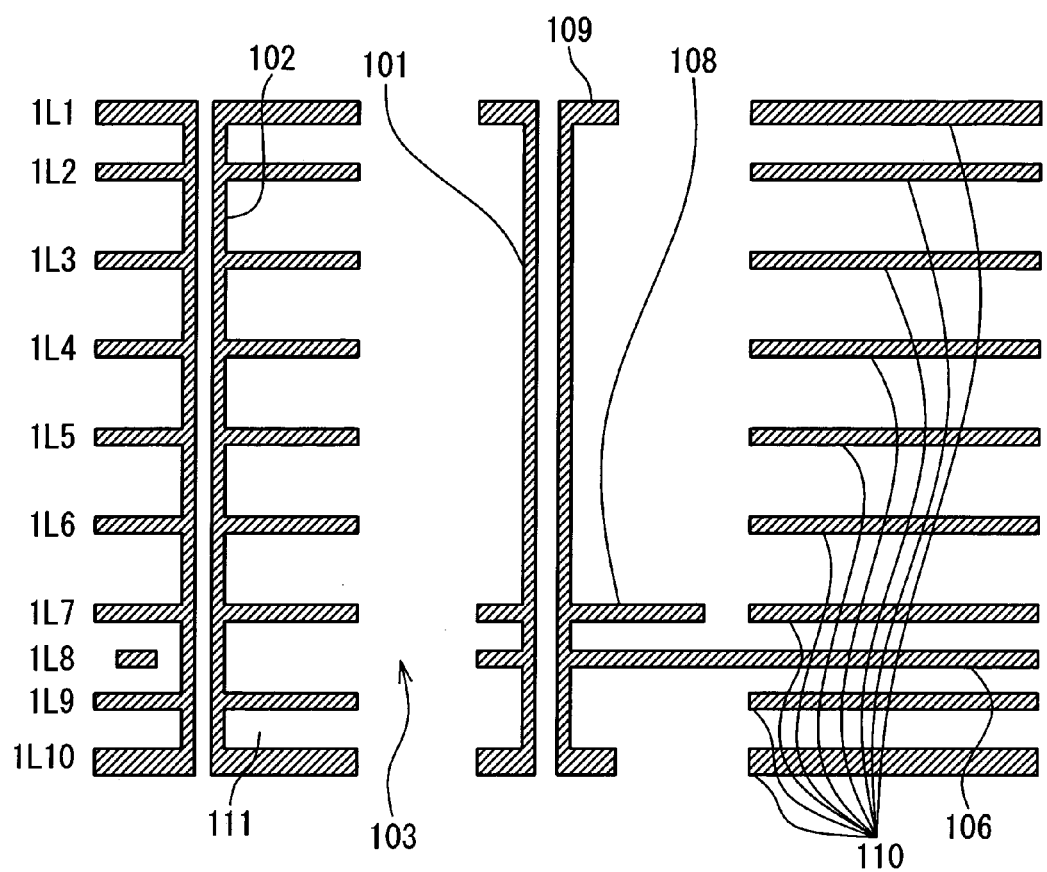
Figure 1D:
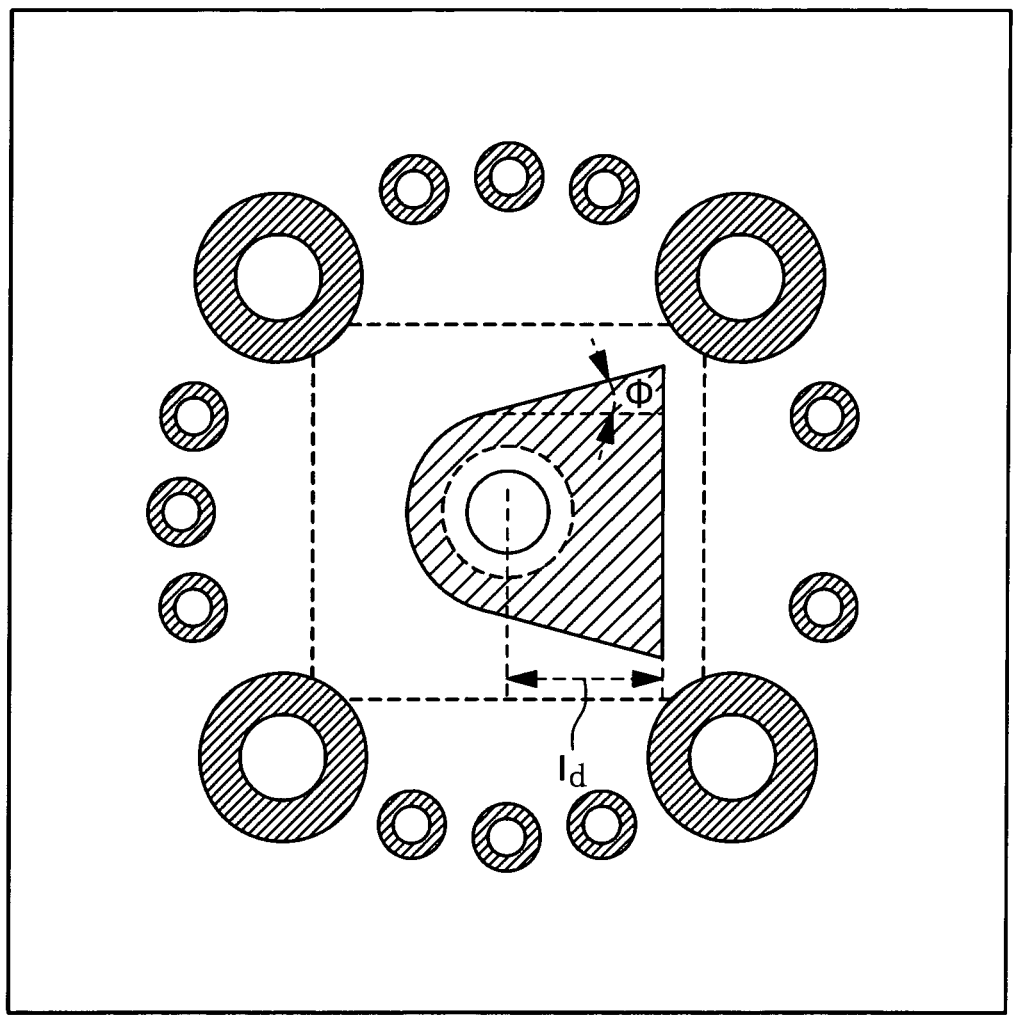

Hereinafter, several types of multi-layer substrate having the multi-tier transition between a signal via structure and a planar transmission line according to the present invention will be described in detail with reference to the attached drawings. Here, it would be well understood that this description should not be viewed as narrowing the appended claims.

In FIGS. 1A to 1D, an example of the multi-layer substrate according to a first exemplary embodiment of the present invention is shown. The example of the multi-layer substrate presents a 10-conductor-layer printed circuit board (PCB) in which an interconnection circuit composed of a via structure and a planar transmission line connected by a multi-tier transition is disposed. It should be well understood that the number of conductor layers in the multi-layer substrate may be different and is determined depending on a specific application.

In FIGS. 1A to 1D, conductor layers 110 are separated by isolating material layers 111. A signal via 101 serves to connect a planar transmission line 106 and a pad 109 which are terminals for coupling other interconnection circuits, components, devices, and so on. It should be noted that in this example of the multi-layer substrate, the signal via 101 is surrounded by ground vias 102 which serve to connect ground pins of a structure and also to decrease leakage loss in the signal via interconnection between the terminal pad 109 and an end of the transmission line 106. A clearance hole 103 is used to isolate the signal via from other conductive parts of the multi-layer substrate.

In a higher frequency range, the number of ground vias and the positions of them as well as the form and dimensions of the clearance hole 103 are important parameters to control the characteristic impedance in the signal via interconnection, in such a way to reduce a return loss from the signal via interconnection, as result from the whole interconnection disposed in the multi-layer substrate that leads to improving its electrical performance. However, in many actual applications, the dimensions of the clearance hole can be large enough. In this case, a segment of the planar transmission line in the area of the clearance hole can be a source of characteristic impedance mismatching due to an increase of the inductive reactance.

Electrical properties of components composed of a device can be particularly characterized by the magnitude of the impedance, and interconnections serving to join these components can be also described by the impedance. Total electrical performance of the device is dependent on the correspondence between the characteristic impedance of the component and the interconnection for which the difference has to be as small as possible. Also, whole an interconnection circuit has to keep a predetermined level of the characteristic impedance that can give lower return and radiation losses, decreasing unwanted resonance as well as better power consumption for the device.

In this case of multi-layer substrates, the characteristic impedance has to show the same value in the interconnection circuit from the terminal pad 109 to and through the transmission line 106. The characteristic impedance of the via structure can be marked as $Z_v$, the characteristic impedance of the planar transmission line can be defined as $Z_{tr}$, and the following condition has to be satisfied:

$$Z_v = Z_{tr} = Z_{connect} \qquad (1)$$

where $Z_{connect}$ is a predetermined magnitude of the characteristic impedance for the interconnection circuit, as an example, 50Ω or 100Ω. In an actual design, it is difficult to keep the same value of the characteristic impedance through the whole of interconnection circuit. That is, why deviation of the characteristic impedance is established on a predetermined level as, for example, ±10% of a nominal magnitude, that is, for example, 50±5Ω or 100±10Ω. Thus, $$Z_v \approx Z_{tr} \qquad (2)$$

It should be noted that, $$Z_v = \sqrt{\frac{L_v}{C_v}} \qquad (3)$$

where $L_v$ is a distributed inductance of the via structure and $C_v$ is a distributed capacitance of the via structure.

Also, $$Z_{tr} = \sqrt{\frac{L_{tr}}{C_{tr}}} \qquad (4)$$

where $L_{tr}$ is a distributed inductance of the transmission line and $C_{tr}$ is a distributed capacitance of the transmission line. The transmission line segment in the area for the clearance hole can play an important role in impedance matching of whole interconnection circuit because its characteristic impedance is different from the characteristic impedance of the transmission line due to absence of ground planes in the clearance hole. The characteristic impedance of this segment, $Z_{sgm}$, can approximately define as:

$$Z_{sgm} = \sqrt{\frac{L_{tr}}{C_{tr} - C_{pl}}} \qquad (5)$$

where $C_{pl}$ is a distributed capacitance introduced by ground planes in the transmission line. Thus, as follows from the equation (5), the characteristic impedance of the transmission line segment due to the capacitance reduction will show the excess inductive reactance, especially, if the electrical length of this segment is large enough. In the present invention, it is proposed to use a multi-tier transition between the signal via and the planar transmission line to enter an additional capacitance, $C_{add}$, for the transmission line segment in the area of the clearance hole, in such way to improve the impedance matching in interconnection circuits disposed in the multilayer substrate. As a result, the characteristic impedance of the transmission line segment will be defined as:

$$Z_{sgm} = \sqrt{\frac{L_{tr}}{C_{tr} - C_{pl} + C_{add}}} \quad (6)$$

If $C_{add} \approx C_{pl}$, then the characteristic impedance of the transmission line segment will correspond to the characteristic impedance of the via structure and the transmission line.

In FIGS. 1A to 1D, the multi-tier transition disposed in the area for the clearance hole includes a signal via pad 104 and a dummy pad 108. It should be noted that the dummy pad 108 includes the signal via pad 107. The dummy pad 108 including the via pad 107 is formed between the terminal pad 109 and the signal via pad 104 in the conductor layer which is neighboring to the signal via pad 104. The form and dimensions of the dummy pad 108 can be obtained as providing the characteristic impedance of the transmission line segment within a predetermined value. For presented trapezoidal dummy pad, the required characteristic impedance can be defined with the step-by-step variation of angle Φ, and length $l_d$ (see FIG. 1D).

It is considered that a numerical example for the multilayer substrate in which a via structure and a planar transmission line are connected by a multi-tier transition as shown in FIGS. 2A to 2F. In this example, the via structure consists of a signal via 201 surrounded by ground vias 202 and has following dimensions: $d_s$=0.7 mm, $d_{p,s}$=1.6 mm, $d_{gr}$=1.75 mm, $D_{gr}$=5.08 mm, $r_{sh}$=3.59 mm, and $d_{gr,sh}$=0.3 mm. The dimensions of the square clearance hole 203 $d_{cle}$=4.2 mm. The substrate (multi-layer PCB) consists of 10 copper planar conductor layers 210 isolated by the FR-4 material 211 with the relative permittivity of $\epsilon_r$=4.2 as assumed in simulations. Spaces between planar conductor layers (see FIG. 2F) are: $h_1$=0.2 mm, $h_2$=0.385 mm, $h_3$=0.2 mm, $h_4$=0.52 mm and $h_5$=0.15 mm; the thickness of conductor planes embedded in the PCB is 0.035 mm; the thicknesses of top and bottom conductor planes are 0.055 mm. The signal via 210 is connected to a strip line 206 disposed in the 8th conductor layer of the PCB by means of the pad 204 having a same diameter as a terminal pad 209 in the top conductor layer. The width of the strip line is 0.11 mm to provide the characteristic impedance $w_{str}$=0.11 mm to provide the characteristic impedance of about 50Ω. In this numerical example, a matching section 205 connecting the signal via pad 204 and the strip line 206 is applied. The matching section 205 is made in the form of the linear taper which has the length of $l_m$=2.1 mm. The dummy pad 208 including the signal via pad 207 of the diameter $d_{p,d}$=1.6 mm is formed as a rectangular plate with sides of $l_d$ and $w_d$.

In FIG. 3, the electrical performance of the interconnection circuit, shown in FIGS. 2A to 2F, from the terminal pad 209 to the end of the transmission line 206 with the above-mentioned dimensions is presented by means of Time Domain Reflectometry (TDR) data. These data are obtained by the use of a 3-dimensional full-wave electromagnetic field solver based on the finite-difference time-domain (FDTD) algorithm. The data are presented by the characteristic impedance in time domain. The figure clears the mechanism explained by the equations (1) to (6). In particular, the solid thin curve shows the maximum magnitude of the characteristic impedance as about 73Ω. This curve showing an inductive type of the characteristic impedance corresponds to the strip line section in the area for the clearance hole which has a same width as the signal strip line in the $8^{th}$-conductor-layer. Application of the linear taper with the length of $l_m$=$d_{cle}$/2 leads to the decrease of the inductive reactance up to about 63Ω (see the dash line in FIG. 3).

In many real applications, such difference in the characteristic impedance of the strip line segment from one side and the via structure and the strip line from another side is large enough. That is, the use of the proposed multi-tier transition composed of the dummy pad is an effective approach to control the characteristic impedance of the strip in the area of the clearance hole as can be traced from other three curves shown in FIG. 3. For these curves, the dummy pad of the rectangular form including the signal via pad is applied. The width of the dummy pad is $w_d$=$d_{p,d}$=1.6 mm and the length, $l_d$, is taken as 1.4 mm, or 1.6 mm, or 1.8 mm. Such step-by-step changing the length of the dummy pad gives a possibility to define a value which is acceptable from practical viewpoint. In considered case this value is $l_d$=1.8 mm which is in the frame of deviation of 10%.

Thus, a present numerical example shows effectiveness of the application of the multi-tier transition and a how to define the optimal dimensions of the dummy pad of this transition. If the application of one dummy pad connected to a signal via is not enough to achieve a required impedance matching, it is proposed to use a number of dummy pads in the multi-tier transition from the signal via to the planar transmission line. In FIGS. 4A to 4D, such multi-tier transition is presented. This transition includes two dummy pads 408 and 413 including signal via pads 407 and 412. In this case, controlling the characteristic impedance is provided based on the number of dummy pads as well as the form and dimensions of dummy pads. Also, the multi-layer transition, shown in FIGS. 4A to 4D, includes matching section 405 including a signal via pad 404. In an exemplary embodiment, the form of the matching section can be defined as a taper from the signal via pad 404 to the strip of the planar transmission line 406 having a length which is equal to or less than the characteristic dimension of the clearance hole 403 in the direction of the transmission line 406.

The proposed multi-tier transitions can be used to obtain a multi-layer substrate providing high-performance differential signaling. It should be noted that differential interconnections are important structures for high-speed system applications because they can significantly eliminate noise from ground planes and reduce radiation from the system.

Figure 5A:
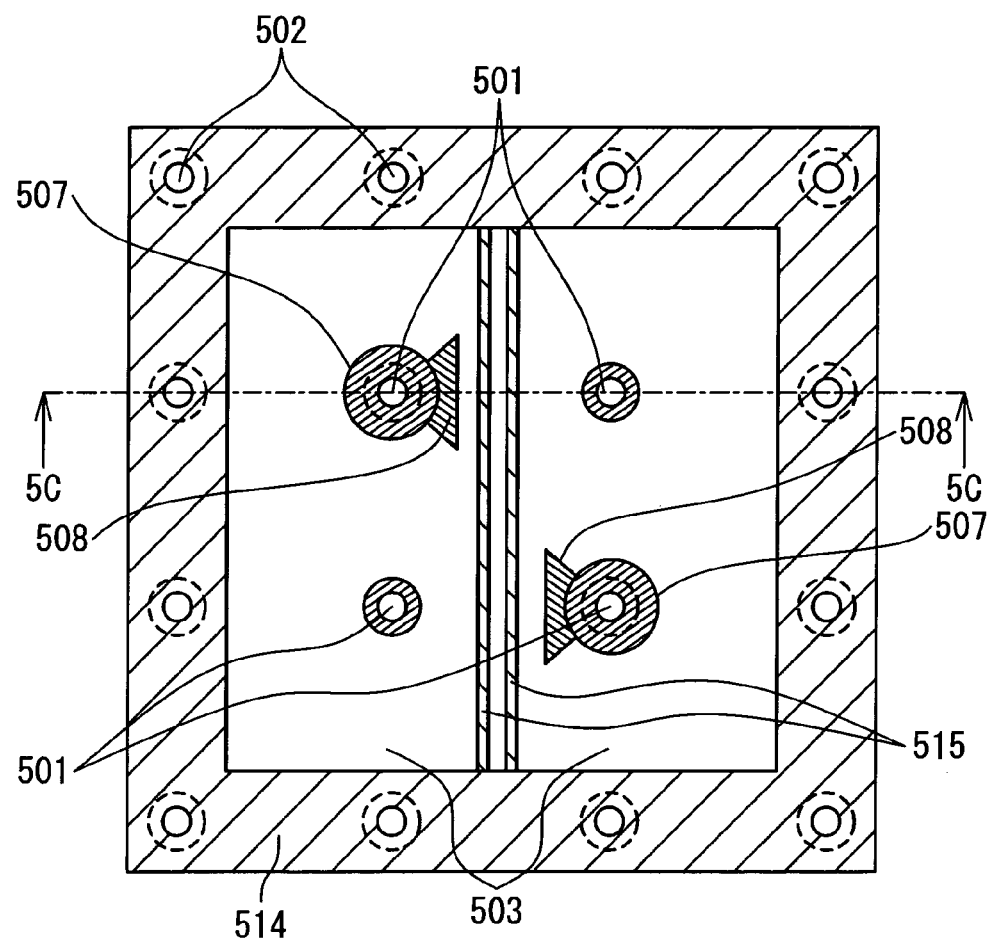
FIGS. 5A to 5C are diagrams showing the multi-layer substrate including a differential multi-tier transition between a differential signal via structure and a differential planar transmission line according to a still another embodiment of the present invention.
Figure 5B:
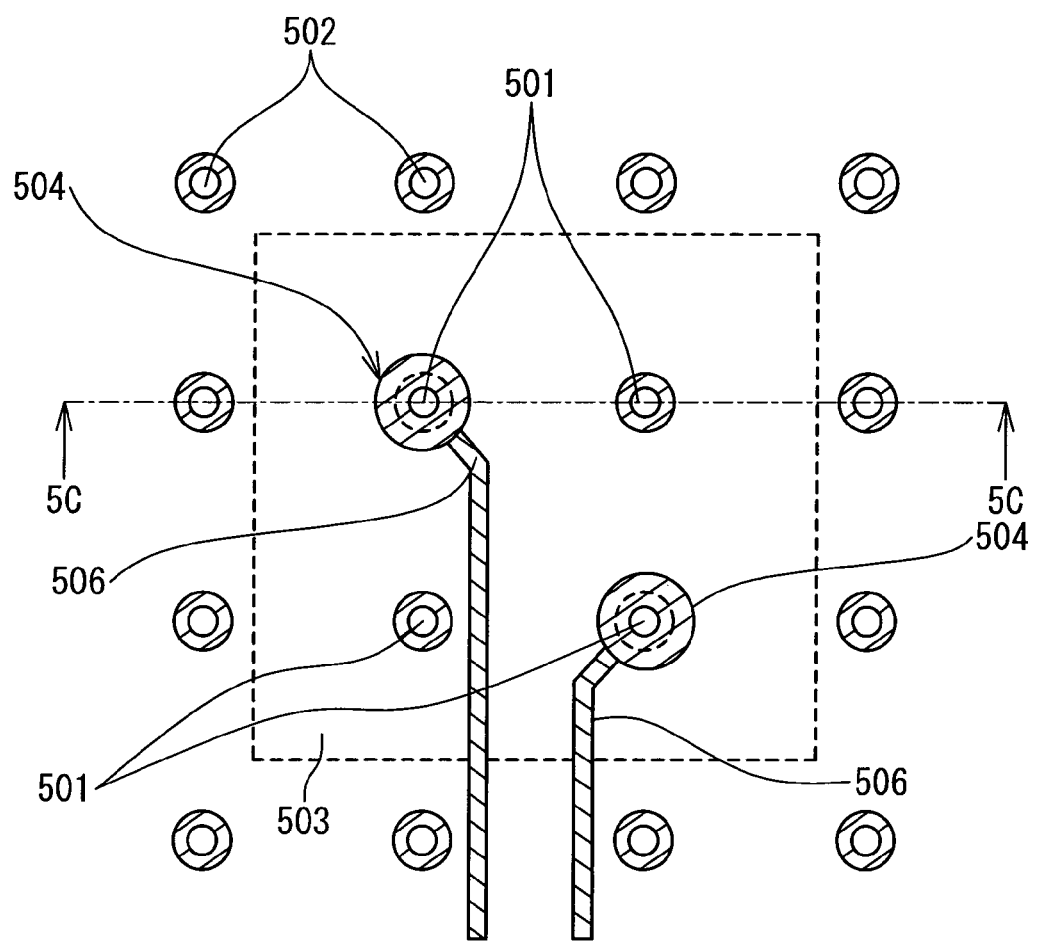
Figure 5C:
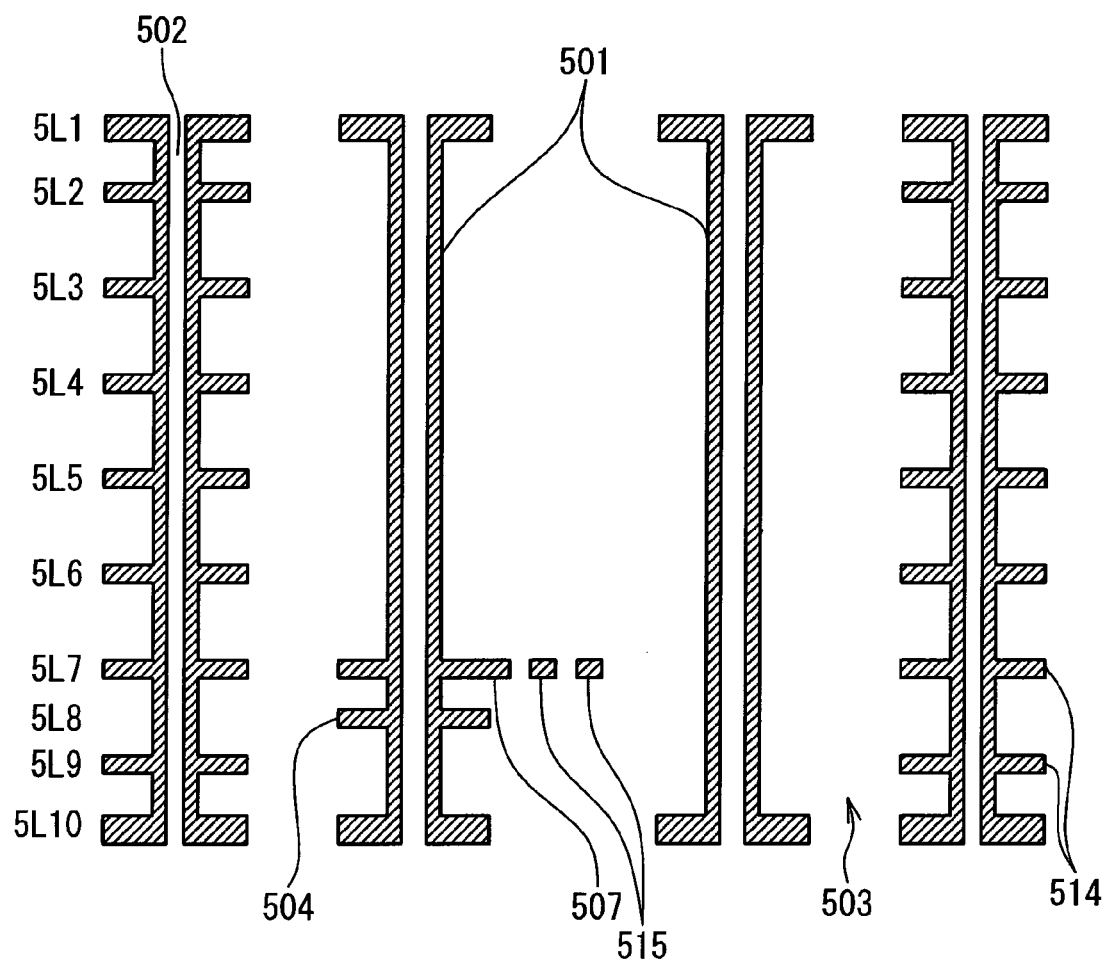

In FIGS. 5A to 5C, a multi-layer substrate including two differential signal via pairs is presented. These via pairs are formed by signal via 501 in such a way as is shown in FIG. 5B, where the connection of the differential transmission line 506 is shown to one differential via pair. Other signal via 501 forms another differential via pair. In FIGS. 5A to 5C, ground vias 502 connected by strips 514 are applied to reduce a leakage loss from differential signal via pairs and also to improve the characteristic impedance control in differential via pairs. A clearance hole 503 separates the via pairs from other conductive parts of the multi-layer substrate. The dimensions of the clearance hole can be large enough in actual applications, and in this case the impedance mismatching can occur in the transmission line segments disposed in the area for the clearance hole. Moreover, this impedance mismatching can lead to a considerable increase of transformation from the differential mode to the common mode, and as a result, to reduction of signal quality.

In the proposed applications to reduce the impedance mismatching and mode transformation in differential interconnections, the multi-tier transition from the differential via pair to the differential transmission line is used. This multi-tier transition includes two dummy pads 508 which also include signal via pads 507. It should be emphasized that a specific ground system 515 is formed in a same conductor layer as dummy pads. In this example, this ground system consists of two ground strips and is disposed above the strip line segments in the area of the clearance hole. The dimensions of these strips and the form and dimensions of the dummy pads are chosen to provide a required impedance matching and level of transformation between differential and common modes.

Figure 6A:
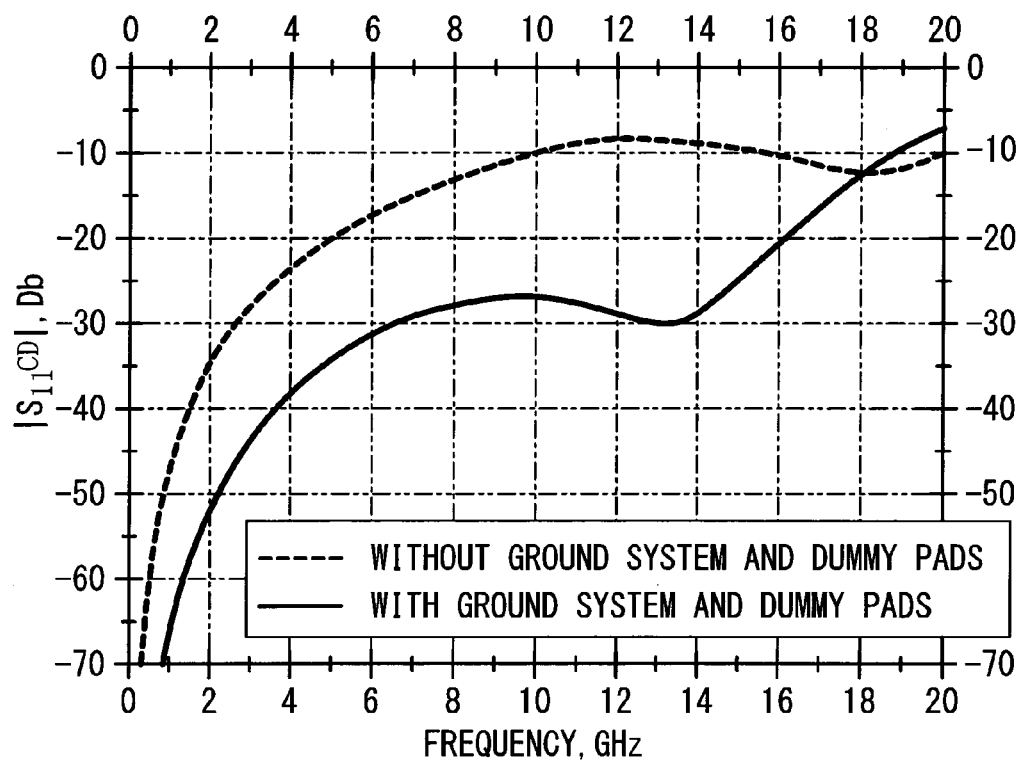
FIGS. 6A and 6B are graphs of magnitudes of the S-parameters for reflected signals which show a considerable reduction of transformation from a differential mode to a common mode for differential interconnections including the multi-tier transition and a ground system.
Figure 6B:
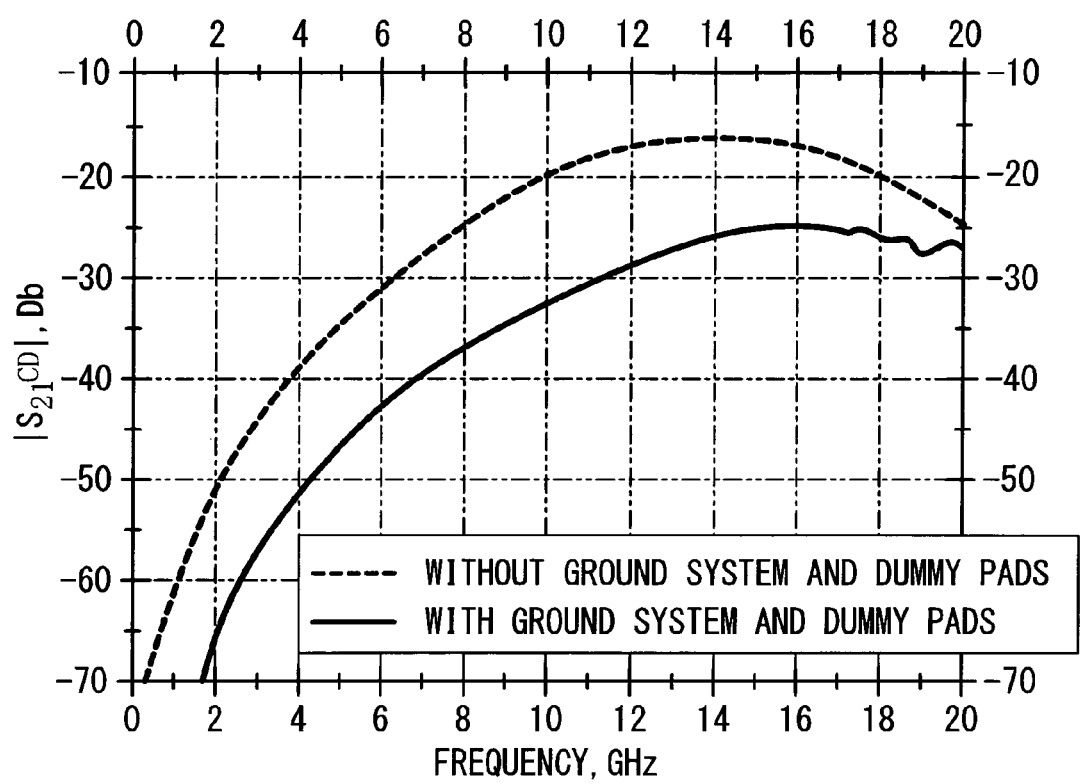

In FIGS. 6A and 6B, numerical examples for transformation from differential mode to the common mode obtained for differential interconnections shown in FIGS. 5A to 5C are presented. The parameters of the multi-layer substrate used in calculations are the same as in FIG. 3, but only the diameters of the signal vias are 0.25 mm, the pitch between signal and ground vias is 1.0 mm, and dimensions of the differential transmission line are chosen as providing 100Ω. As seen from these figures, the application of proposed dummy pads and ground system can considerably decrease transformation from the differential mode to the common mode in differential interconnections based on the multi-layer substrate technology. Moreover, this reduction of the transformation between modes also means improvement of the impedance matching in the differential interconnections composed of the multi-tier transition with the specific round system.

It is well-understandable that a multi-tier transition in a multi-layer substrate can be also formed for vertical interconnections which are not surrounded by ground vias (that is for vertical interconnections comprising signal vias only). Also, the multi-tier transition can be applied in signal via clearance hole having different shapes (as for example, round, elliptical, rectangular or so on).

The invention claimed is:

1. A multi-layer substrate comprising a planar transmission line and a signal via, wherein said planar transmission line and said signal via are connected by a multi-tier transition comprising:
   a signal via pad used for a full-value connection of said signal via and said planar transmission line;
   an another signal via pad connected to said signal via and disposed at a conductor layer which is nearest to said signal via pad between a signal terminal of said signal via and said signal via pad; and
   a dummy pad connected to said another signal via pad, formed in an area of a clearance hole at said conductor layer and isolated from said conductor layer,
   wherein said dummy pad comprises a form covering an area around a strip segment of said planar transmission line disposed in said area of said clearance hole and providing a coupling to said strip segment connecting said signal via pad and said planar transmission line and said form does not comprise a conductive part in a side of said clearance hole which is opposite to said strip segment.

2. The multi-layer substrate according to claim 1, wherein said multi-tier transition comprises said signal via pad, a number of other signal via pads disposed at conductor layers which are nearest to said another signal via pad between said signal terminal of said signal via and said signal via pad and a number of other dummy pads connected to said other signal via pads and isolated from said conductor layers.

3. The multi-layer substrate according to claim 1, wherein said multi-tier transition comprises said signal via pad, said another signal via pad, said dummy pad and a matching section as a taper connecting said signal via pad and said planar transmission line.

4. The multi-layer substrate according to claim 2, wherein said multi-tier transition comprises said signal via pad, said number of other signal via pads, said number of other dummy pads and a matching section as a taper connecting said signal via pad and said planar transmission line.

* * * * *

UNITED STATES PATENT AND TRADEMARK OFFICE
CERTIFICATE OF CORRECTION

PATENT NO. : 8,476,537 B2  Page 1 of 1
APPLICATION NO. : 12/675678
DATED : July 2, 2013
INVENTOR(S) : Taras Kushta It is certified that error appears in the above-identified patent and that said Letters Patent is hereby corrected as shown below:

In the Drawings

Figure 2A:
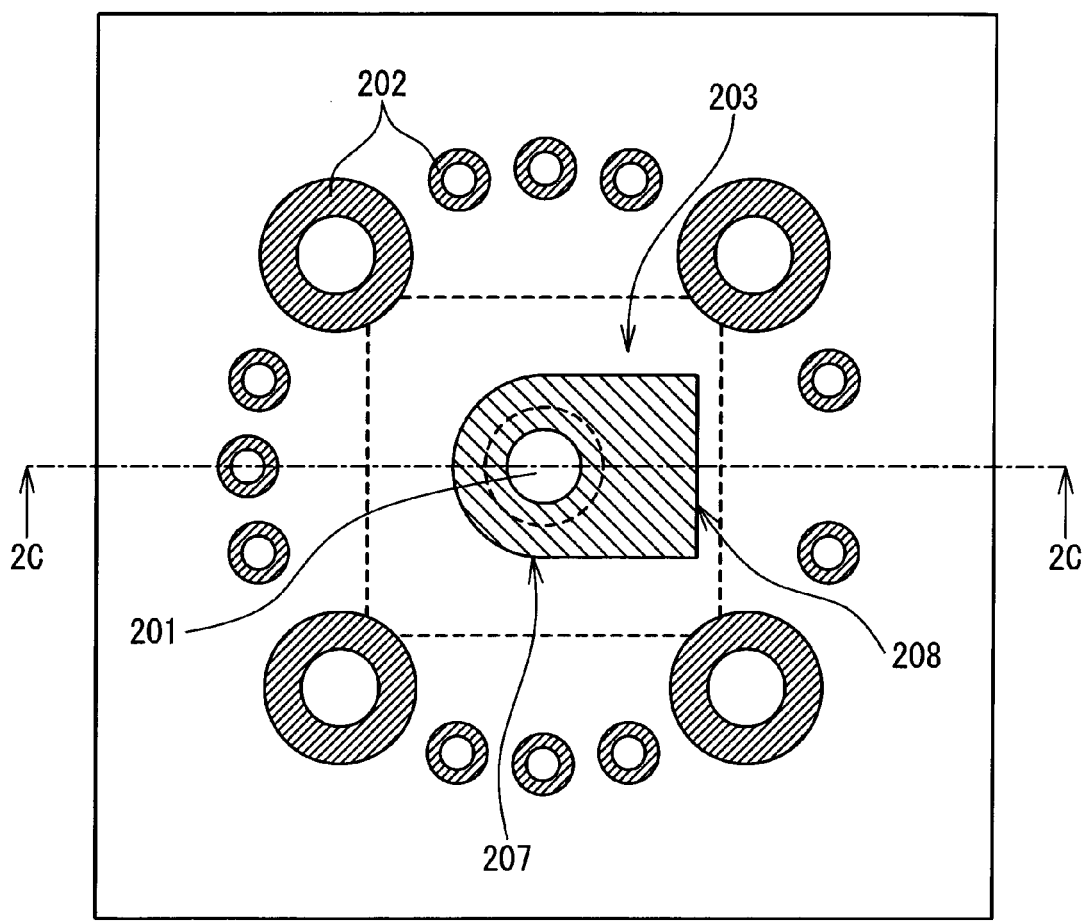
FIGS. 2A to 2F are diagrams showing a numerical example of the multi-layer substrate including the multi-tier transition between the signal via structure and the planar transmission line according to another embodiment of the present invention.
Figure 2B:
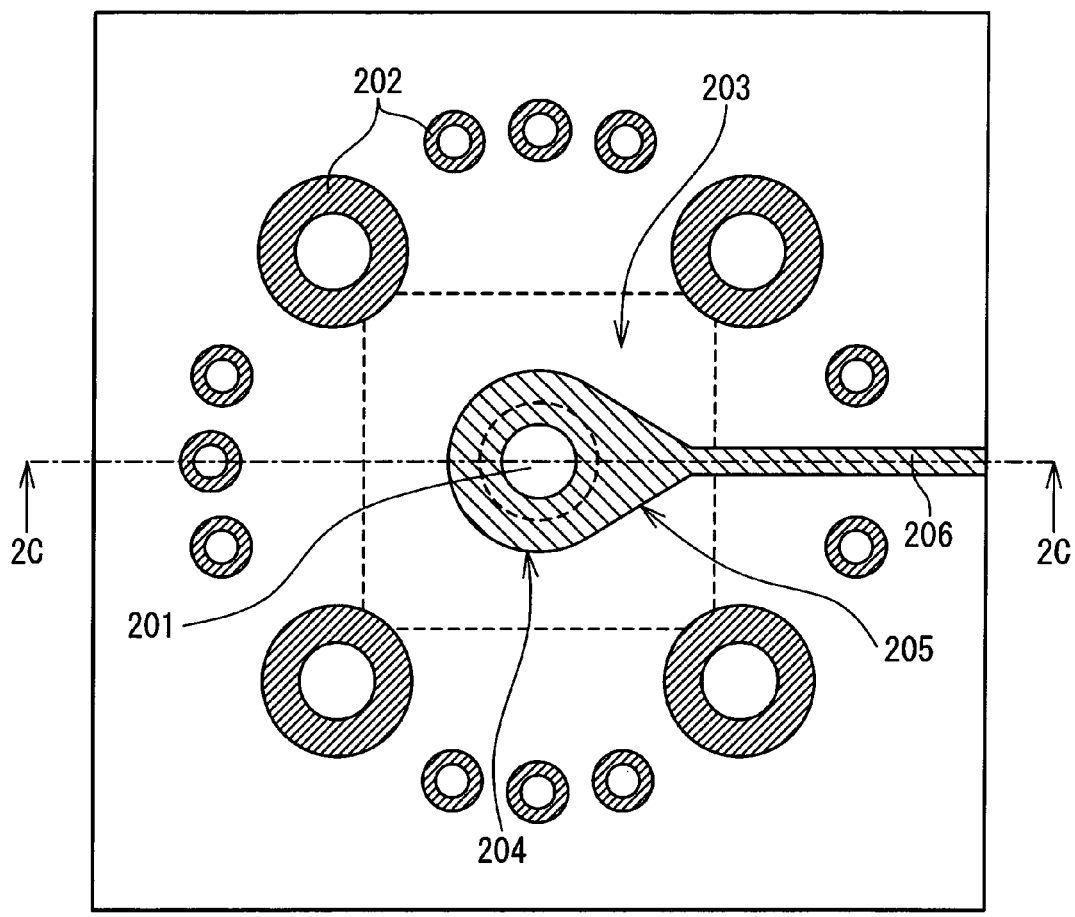
Figure 2C:
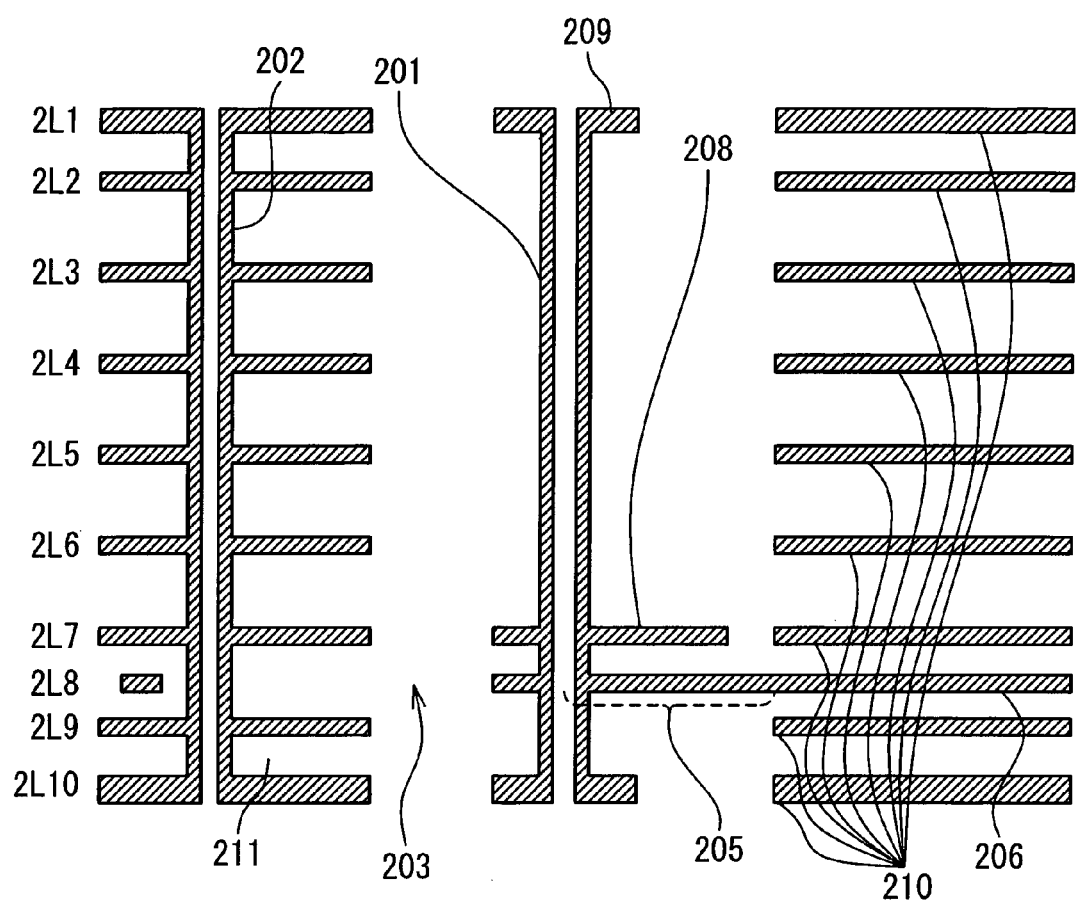
Figure 2D:
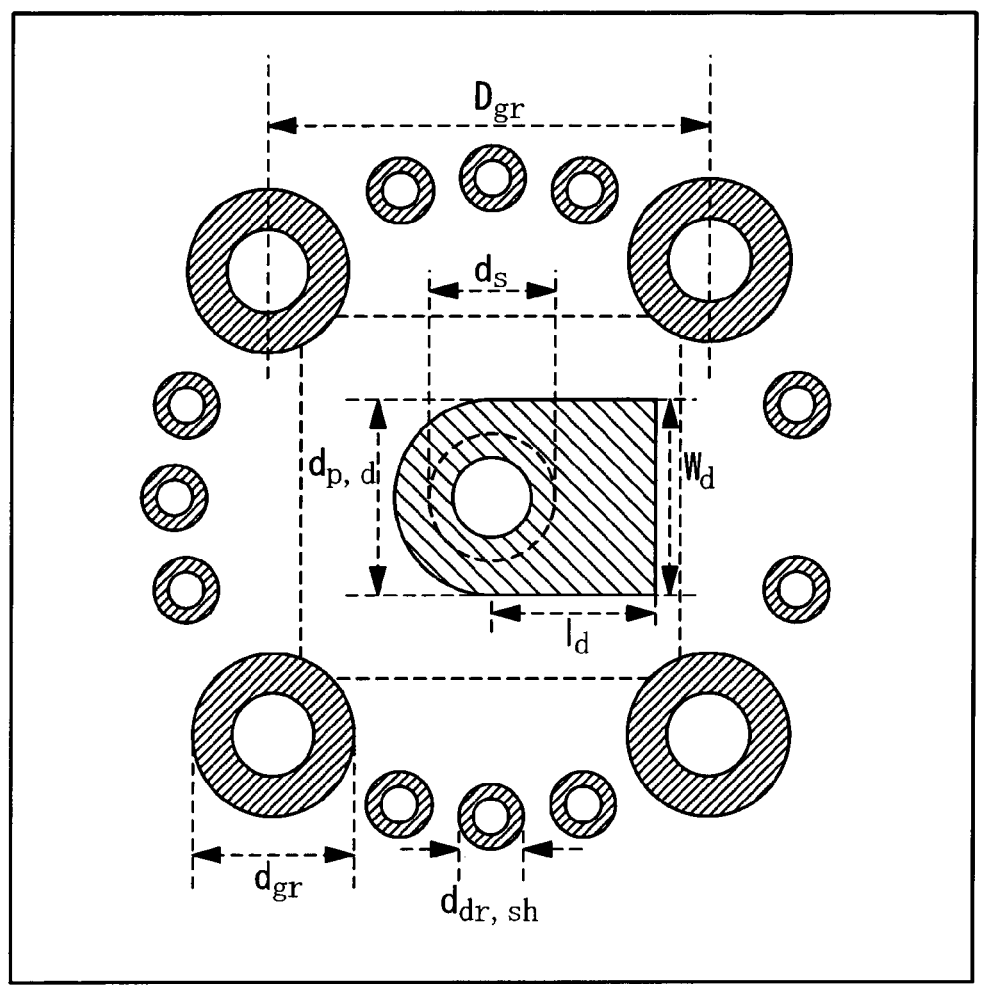
Figure 2E:
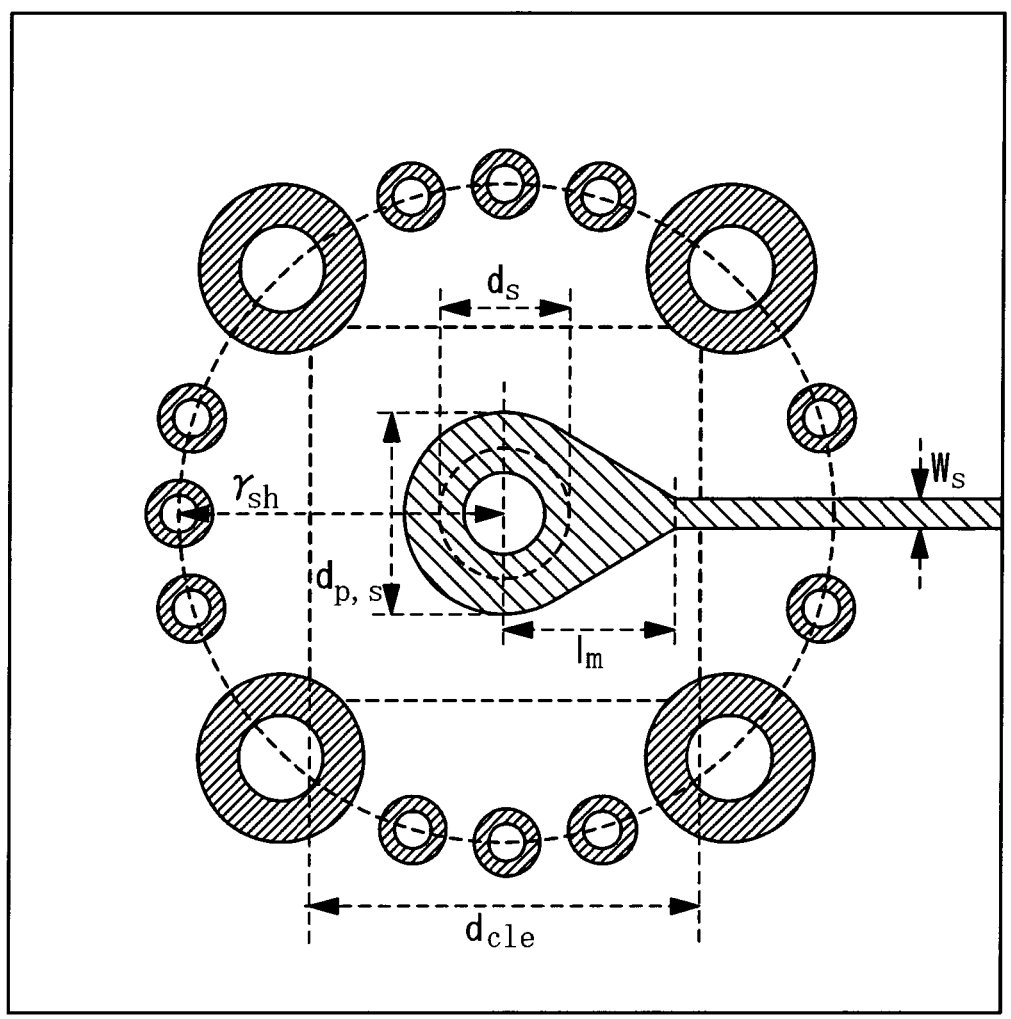
Figure 2F:
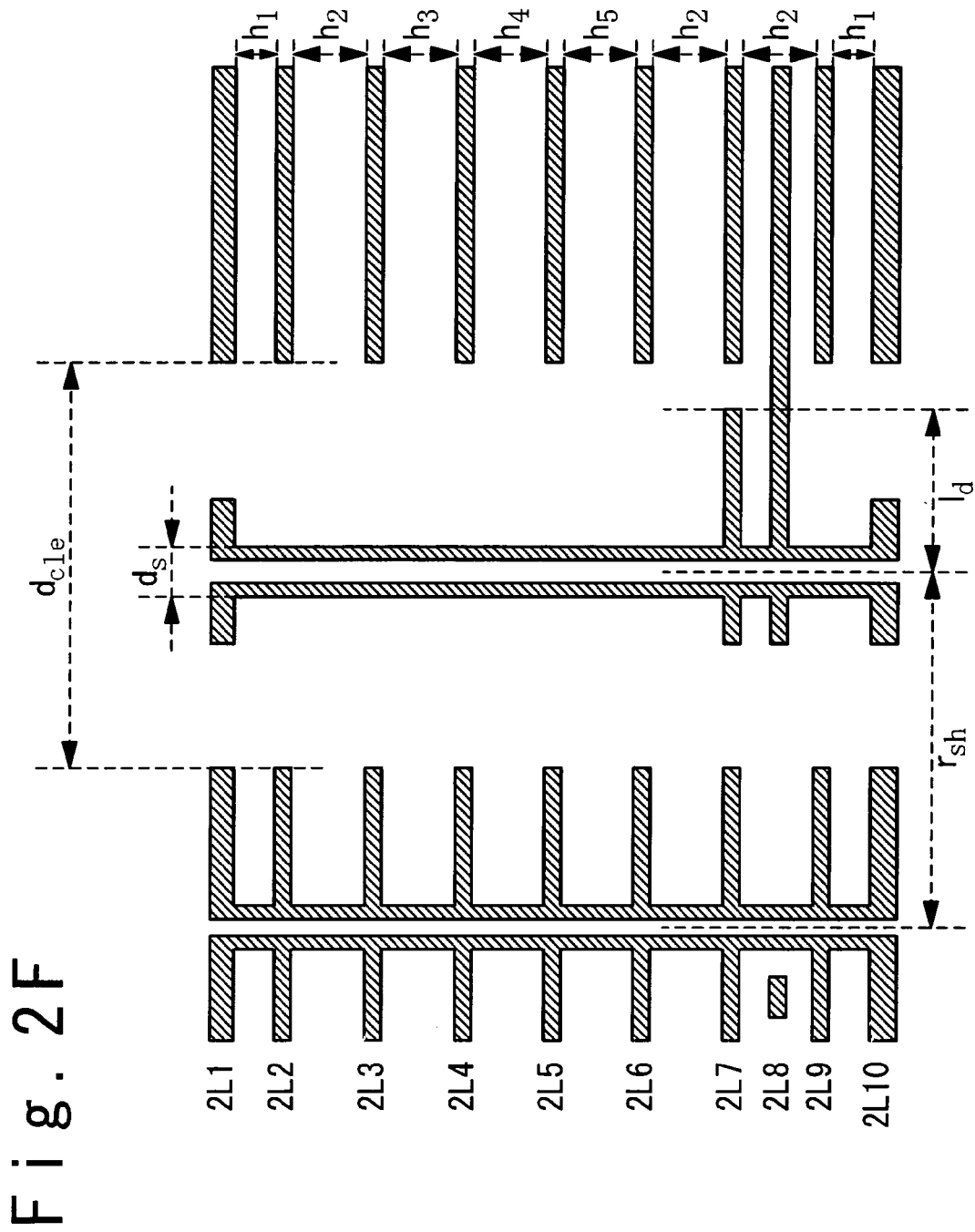
Figure 4A:
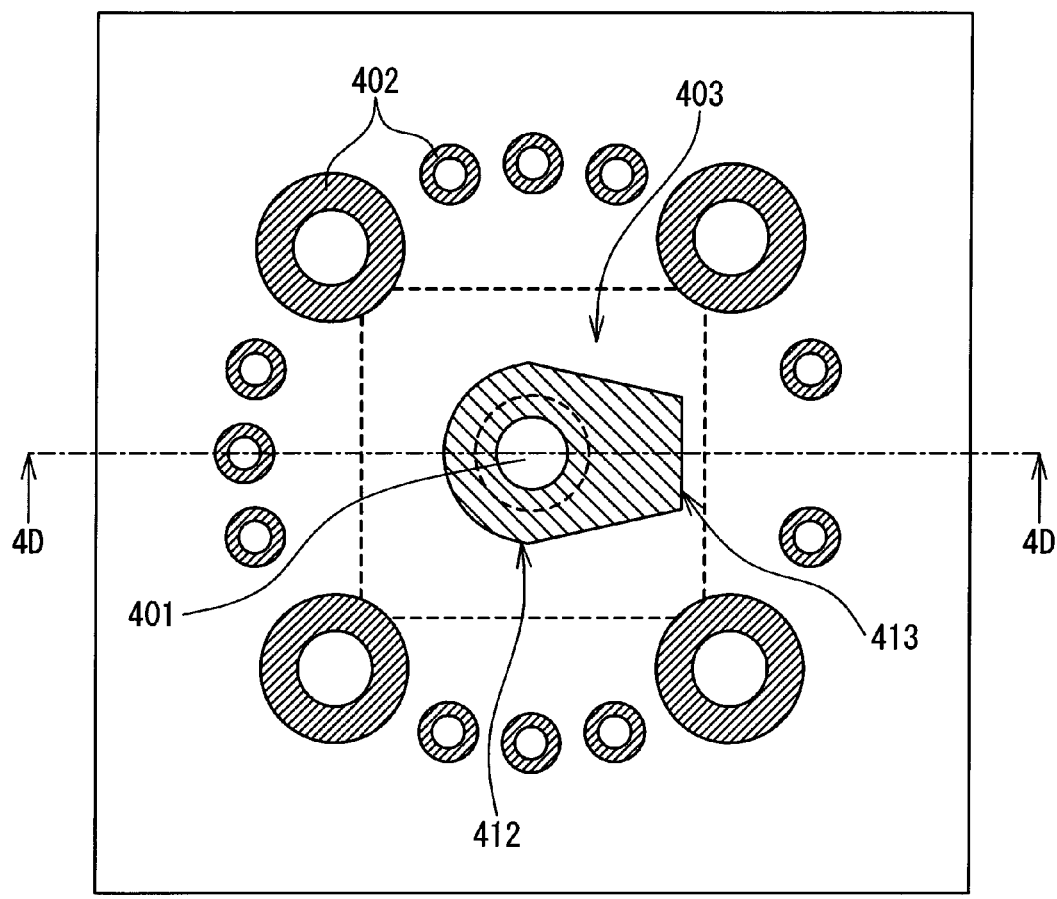
FIGS. 4A to 4D are diagrams showing the multi-layer substrate including the multi-tier transition between the signal via structure and the planar transmission line according to a still another embodiment of the present invention.
Figure 4B:
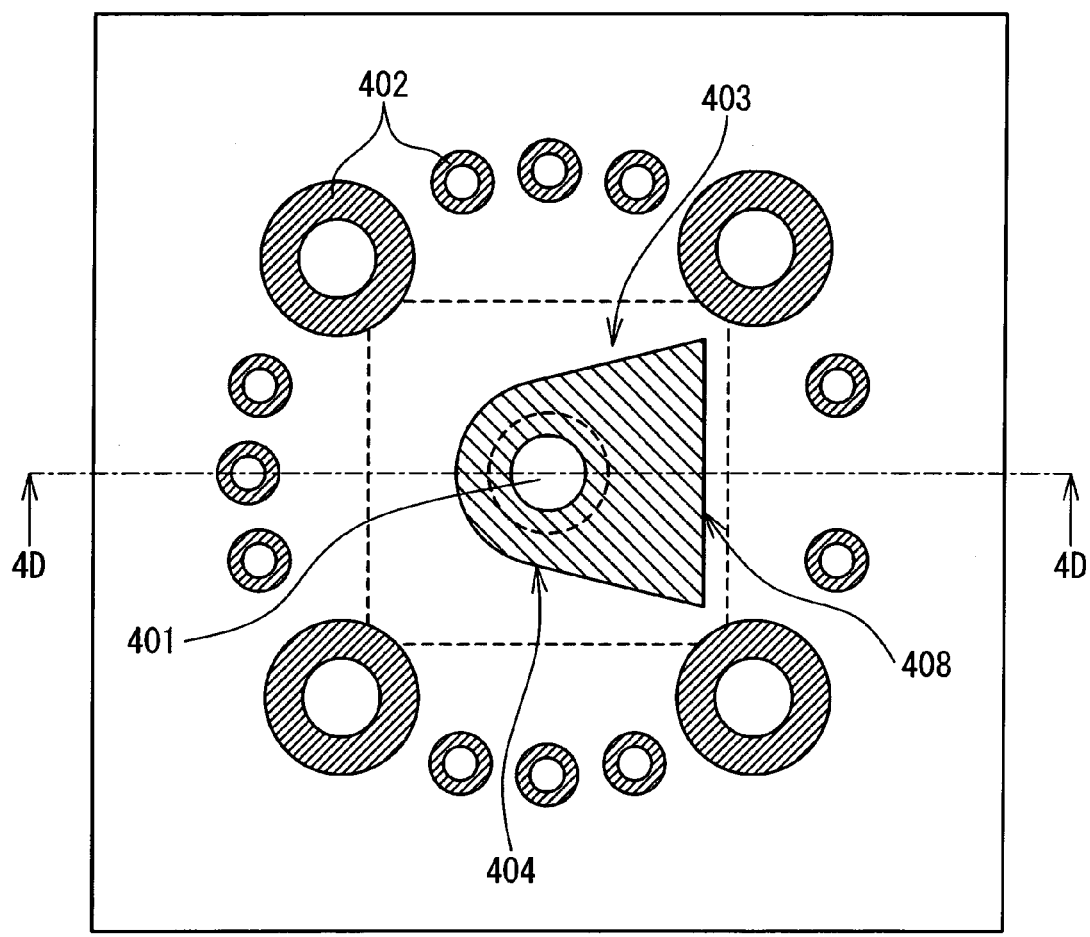
Figure 4C:
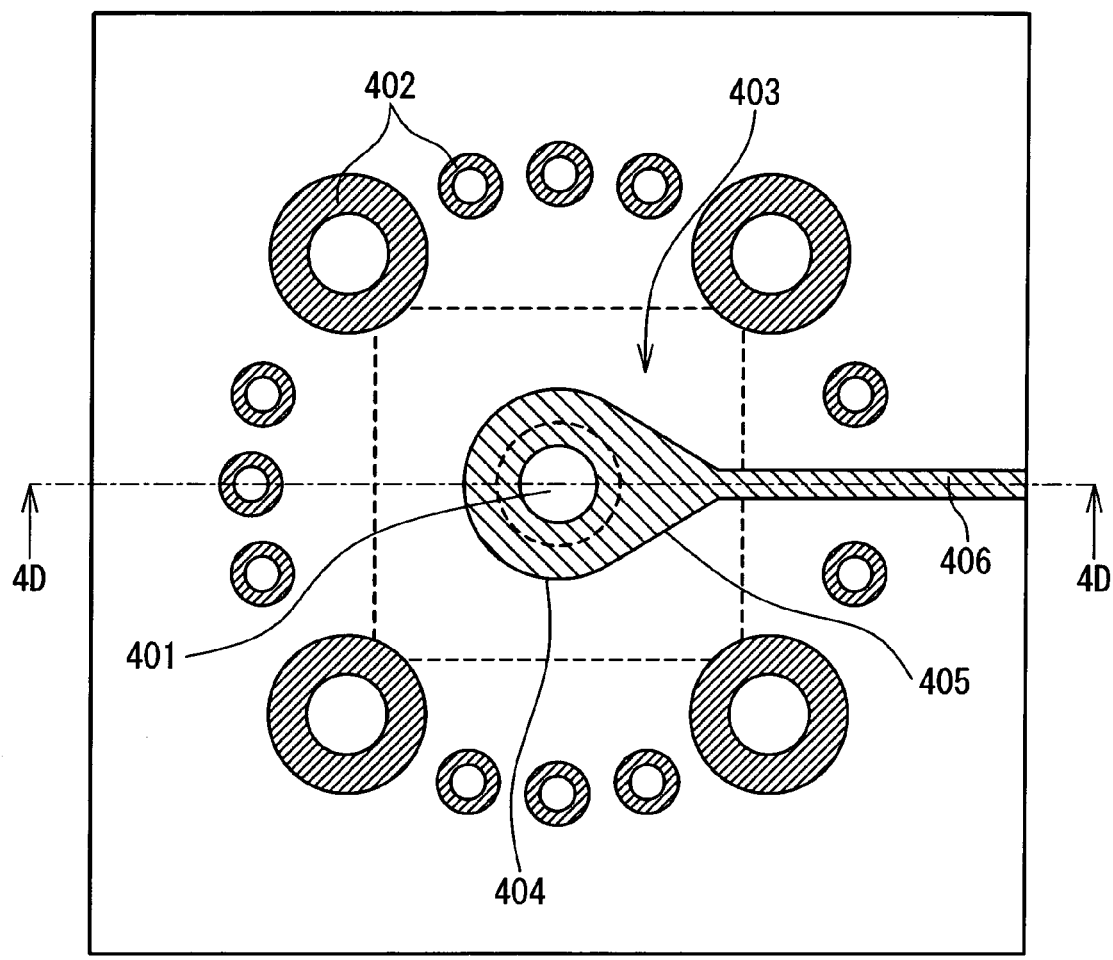
Figure 4D:
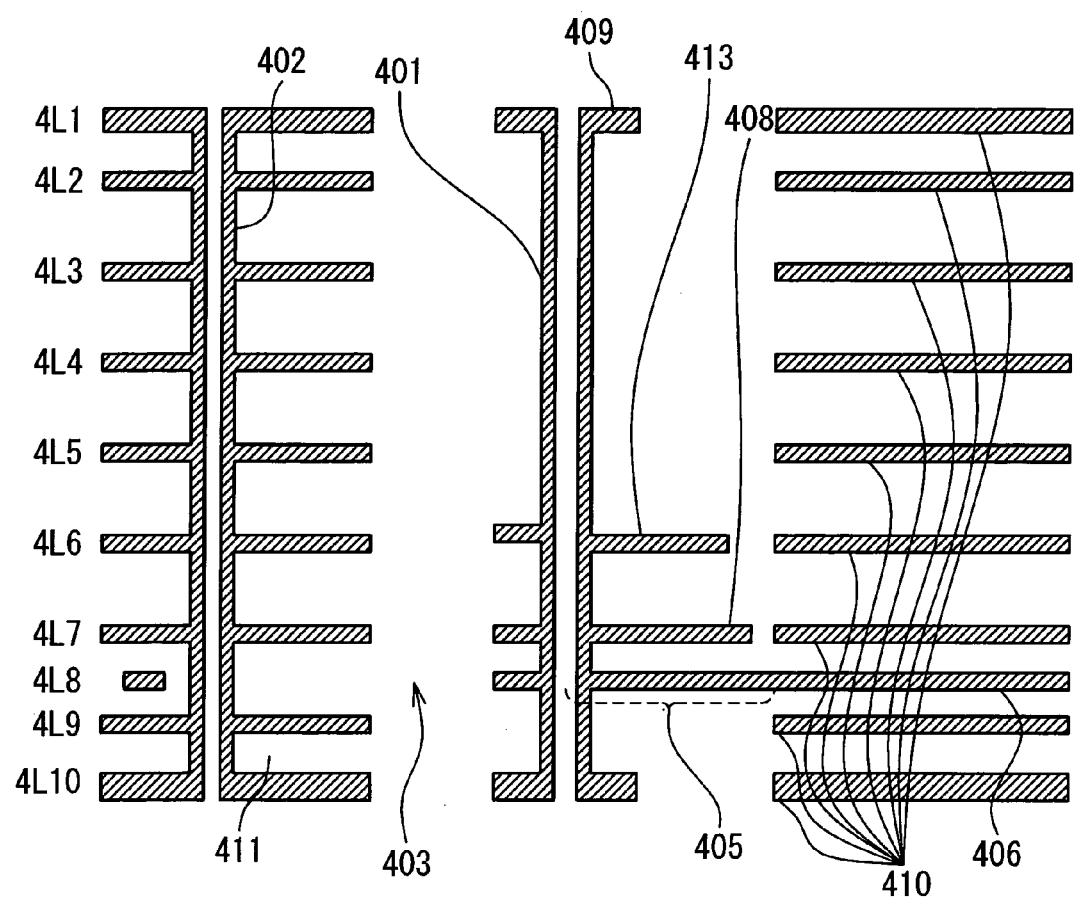

Sheet 8 of 20, Fig. 2D: Delete "$d_{dr, sh}$" and insert -- $d_{gr, sh}$ --

In the Specification

Column 4, Line 34: Delete "Zv≈Ztr" and insert -- $Z_v \approx Z_{tr}$ --

Column 5, Line 32: Delete "Φ," and insert -- Φ --

Column 5, Line 53-54: After "is" delete "0.11 mm to provide the characteristic impedance"

Signed and Sealed this
Twenty-first Day of October, 2014

Michelle K. Lee
*Deputy Director of the United States Patent and Trademark Office*